(12) United States Patent
McDonald

(10) Patent No.: US 7,377,961 B2
(45) Date of Patent: May 27, 2008

(54) HYDROGEN VENT FOR OPTOELECTRONIC PACKAGES WITH RESISTIVE THERMAL DEVICE (RTD)

(75) Inventor: Mark E. McDonald, Milpitas, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/925,321

(22) Filed: Aug. 23, 2004

(65) Prior Publication Data

US 2005/0156159 A1 Jul. 21, 2005

Related U.S. Application Data

(60) Provisional application No. 60/536,104, filed on Jan. 12, 2004.

(51) Int. Cl.
*B01D 53/22* (2006.01)
(52) U.S. Cl. .............. 96/4; 95/55; 257/682; 438/115
(58) Field of Classification Search .............. 437/210, 437/209, 215, 217, 220, 221; 257/682, 279; 338/25; 95/55; 96/4; 438/115, 209, 210, 438/215, 217, 220, 221
See application file for complete search history.

(56) References Cited

U.S. PATENT DOCUMENTS

| | | | |
|---|---|---|---|
| 4,791,398 A | * | 12/1988 | Sittler et al. .............. 338/25 |
| 5,543,364 A | | 8/1996 | Stupian et al. |
| 5,861,665 A | * | 1/1999 | Derkits et al. .............. 257/682 |
| 6,203,869 B1 | | 3/2001 | Dougherty et al. |
| 6,428,612 B1 | | 8/2002 | McPhilmy et al. |
| 2004/0106001 A1 | | 6/2004 | Kovacs et al. |

FOREIGN PATENT DOCUMENTS

| | | |
|---|---|---|
| DE | 100 49 556 A1 | 6/2001 |
| EP | 0 837 502 A2 | 4/1998 |
| EP | 0 878 845 A2 | 11/1998 |

OTHER PUBLICATIONS

Patent Abstracts of Japan; vol. 2000, No. 08; Oct. 6, 2000. Furukawa Electric Co. Ltd.
PCT ISR & WO dated Dec. 8, 2005.
Marc Finot et al., "Automated Optical Packaging Technology for 10 Gb/s Transceivers and its Application to a Low-Cost Full C-Band Tunable Transmitter", Intel Technology Journal, May 10, 2004, pp. 101-114, vol. 08, Issue 02, ISSN: 1535-864X, Intel Corporation.
"Palladium Membrane Technology", Johnson Matthey, pp. 1-4, 2004, Retreived from WWW on Aug. 18, 2004 at: <hydrogentechnology.com/html/pd_membrane_purification. html>.

* cited by examiner

*Primary Examiner*—Duane Smith
*Assistant Examiner*—Sonji Turner
(74) *Attorney, Agent, or Firm*—Kevin A. Reif

(57) ABSTRACT

Thermally tuned lasers may use a resistive thermal device (RTD), sensitive to hydrogen, within a hermetic enclosure. Over time, hydrogen trapped within the enclosure or out gassed from other components within the enclosure may degrade the accuracy of the RTD. A vent comprising a hydrogen selective permeable membrane, such as palladium or a palladium alloy, provided in the enclosure vents hydrogen to mitigate damage to the RTD.

14 Claims, 2 Drawing Sheets

HYDROGEN VENT FOR OPTOELECTRONIC PACKAGES WITH RESISTIVE THERMAL DEVICE (RTD)

CROSS-REFERENCE TO RELATED APPLICATION

This application claims priority to U.S. Provisional Application Ser. No. 60/536,104, filed on Jan. 12, 2004, the contents of which are herein incorporated by reference.

BACKGROUND INFORMATION

Modern microelectronic and optoelectronic packages are often hermetically sealed to protect the delicate components inside from outside contamination. A basic hermetic package may comprise a box like structure surrounding the components with leads extending through the sides of the package electrically connecting the components to the outside. In the case of optical components an optical fiber may extend through the package through a sealed ferrule. The package may be filled with an inert gas such as Nitrogen or Argon to flush moisture and other harmful gases out of the package. A lid may then be fitted over the package and sealed closed.

Once sealed, the contents of the package are protected from outside contamination. However, hermetically sealed packages of this type cannot protect against harmful contaminates that may originate from within the package. One such contaminate that may be found in abundance is hydrogen ($H_2$). In particular, hydrogen can cause a number of state changes with enclosed component materials, including formation of hydrides, and reduction of oxides. In the case of metal oxide reduction, the resulting water trace gas can itself create a significant reliability problem.

While hydrogen should not present in the initial atmosphere within the sealed package, hydrogen can and does outgas from steel (which often have an annealing step in a hydrogen atmosphere), platings (e.g., Ni/Au), and from other trapped locations, such as epoxies.

Typical hydrogen mitigation approaches are those which reduce the potential hydrogen load. These approaches include "bakeout" which involves driving trapped hydrogen off with heat, and "getting" which involves locking the hydrogen into another form such as hydride or water.

Regarding the first mitigation approach, bakeout may be time consuming and can require high temperatures incompatible with the component materials. Even for those materials which can survive the bakeout conditions, because of asymptotic nature of hydrogen bakeout, the materials typically retain some level of hydrogen that will outgas over the lifetime of the product.

With regard to the second mitigation approach, so called "hydrogen getters" have been used to absorb or "get" the out gassing hydrogen and trap it before serious harm occurs. A hydrogen getter may comprise any one of a number of materials placed within the hermetic package prior to sealing that react with hydrogen thus removing it from the atmosphere within the hermetic package. For example, certain metal alloys may react with hydrogen to form metal hydrides. These types of getters typically require high temperatures to work effectively and therefore limited in their application. Unsaturated organic compounds have also been used in conjunction with the metal Palladium (Pd). Palladium functions as a catalyst to bind hydrogen to the functional groups of the organic molecules thus removing them from the atmosphere within the hermetic package. Examples of hydrogen getters sealed within the hermetic package are disclosed for example in U.S. Pat. No. 6,203,869 to Dougherty et al. and U.S. Pat. No. 6,428,612 to McPhilmy et al.

Hydrogen getters suffer a fundamental problem of finite capacity. If the amount of hydrogen outgas exceeds the getter capacity (i.e. the getter material become saturated or totally reacted), hydrogen will remain within the enclosure. The form of hydrogen storage can itself be problematic. For example, some getters form water vapor that must be managed. Solid solution getters can flake under the strain placed on the material due to hydrogen absorption, resulting in potential particle debris that must be managed.

DETAILED DESCRIPTION

Figure 1:
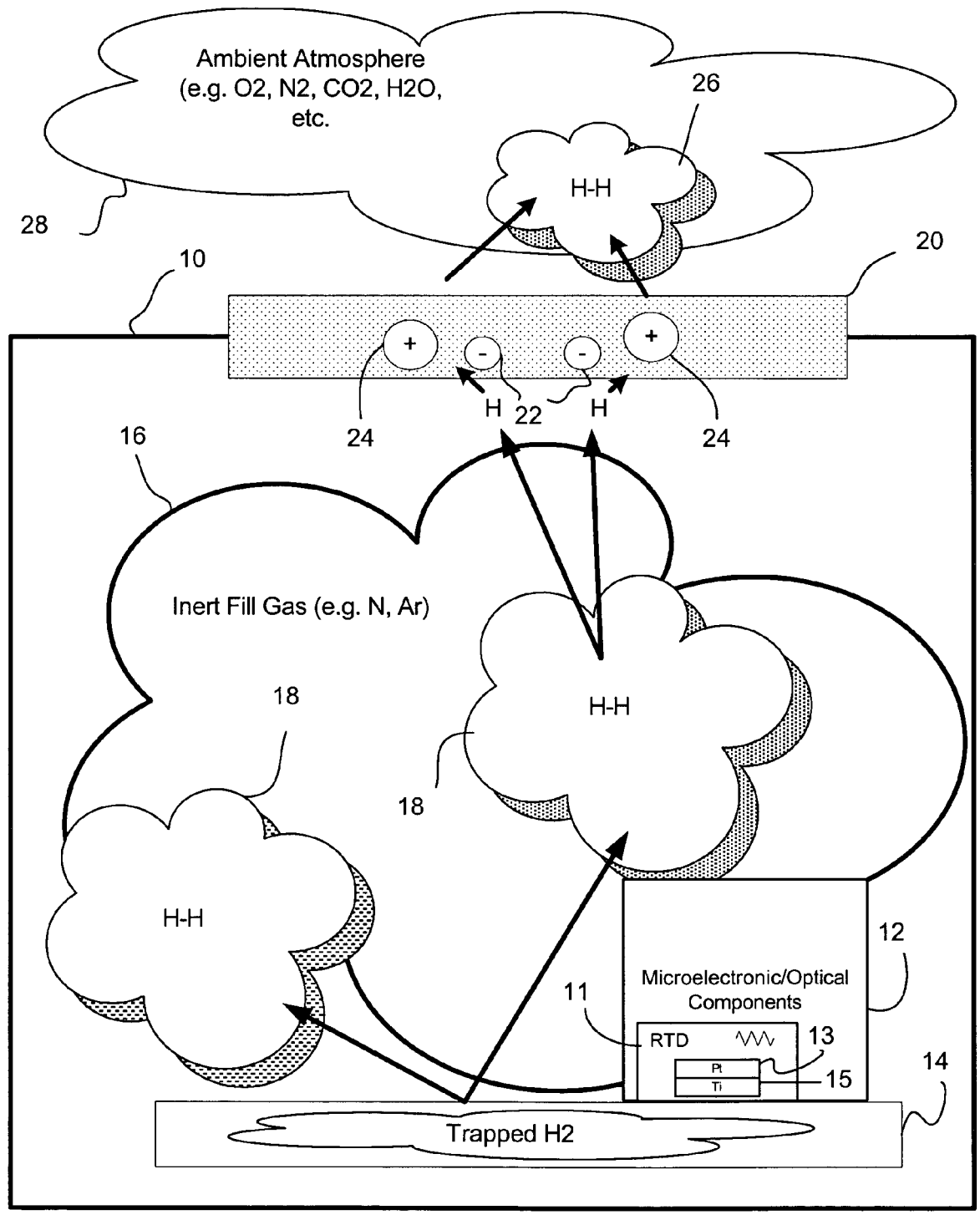
FIG. 1 is a diagram illustrating a hermetic package according to embodiments of the invention.

Referring now to FIG. 1 there is shown an example of a hermetic enclosure 10 for housing various sensitive components such as, for example, electronic, optical, optoelectronic, or micro-electromechanical system (MEMS) components 12. These components may comprise a broadly tunable, high-output power laser may be optimized for Dense Wavelength Division Multiplexing (DWDM) transport networks. The laser may use an external cavity design with intracavity thermally tuned filters fabricated from silicon wafers with optical Micro Electro-Mechanical System (MEMs) technology.

Temperature monitoring for control of the thermally tuned filters may be accomplished by an integrated Resistive Thermal Device (RTD) thermometer 11 that uses a platinum (Pt) sensing element 13 on a Titanium (Ti) adhesion layer 15. The Pt sensing element 13 changes resistance with temperature, and readout of this resistance allows temperature feedback control of the optical components 12. Platinum 13 tends not to adhere well to most materials, owing to its chemical inertness. An adhesion promoting layer of Ti 15 may be used. Alternately other metals such as Chromium (Cr) may be used. In addition to the primary function of changing resistance vs. temperature, the Pt layer 13 serves as a catalyst for dissociating $H_2$ in to 2 H. The monatomic hydrogen is highly chemically active, and can be conducted through the Pt layer 13 to the Ti layer 15. The Ti layer 15 typically has some native oxide. The chemically active H will react with Oxygen (O) loosely bound to Ti (adsorbed) 15. This change in the Ti layer 15 oxidation state changes its resistance (reduced resistance for this metal system), which is in parallel to the Pt layer 13 resistance. While the Ti layer 15 resistance is much greater than the Pt resistance 13, there is a small change in the composite resistance of the Ti/Pt combination forming the RTD 11 . Hence, the RTD 11 produces a resistance change signal in response to the chemistry rather than purely in response to temperature. This change in absolute accuracy may lead to incorrect tuning of the monitored components 12.

This oxidation state change differs for different metals. For example, a Cr/Pt composite drifts upward in the presence of H. Note that oxidation of Ti/Pt (e.g., heating in an oxygen/oxidizer bearing atmosphere) causes an increase in resistance.

As a result, control of the atmosphere inside the hermetic package may be desired. While most gases can be excluded at time of hermetic sealing with proper manufacturing processes, hydrogen is often trapped in materials. The hermetic sealing actually then leads to a build up of hydrogen, and a slow drift in RTD resistance, and a slow drift in lasing wavelength.

Still referring to FIG. 1, also within the hermetic enclosure 10 are other items which may contain trapped hydrogen 14 such as steel, platings (e.g., Ni/Au), and from other trapped locations such as epoxies present in the package 10. Initially, the hermetic enclosure may be filed with an inert gas 16, such as Nitrogen or Argon. However, over time the trapped hydrogen 14 will outgas and the outgas hydrogen 18 will contaminate the interior of the enclosure 10 and may cause damage to the components 12 including the RTD 11. According to embodiments of the invention, a hydrogen vent 20 is provided trough which the outgas hydrogen 18 may escape the enclosure 10.

The vent 20 may comprise a hydrogen selective membrane such as Palladium (Pd) or palladium alloys. Diffusing hydrogen through palladium has been used in industry as a method for making ultra pure hydrogen gas. In the instant application when the outgas hydrogen 18 reaches the vent 20 the $H_2$ molecule disassociates into individual hydrogen atoms. The hydrogen looses its electron 22 to the palladium comprising the vent 20 and diffuses though the membrane as an ion (i.e. proton) 24. At the outside of the enclosure 10, the opposite mechanism takes place with the proton 24 regaining an electron 22 and recombining to form hydrogen gas 26 released into the ambient atmosphere 28.

The vent 20 thus provides a pathway for hydrogen venting that can cap hydrogen concentration within the enclosure 10 at atmospheric level of about 0.5 parts per million (ppm). In addition since the membrane covering the vent 20 may be selective to hydrogen (i.e., there is no other known molecule or atom that will diffuse there through) the hermetic package remains uncompromised since it retains the inert fill gas 16 and ambient atmospheric gases 28 are prevented from entering the enclosure 10.

Figure 2:
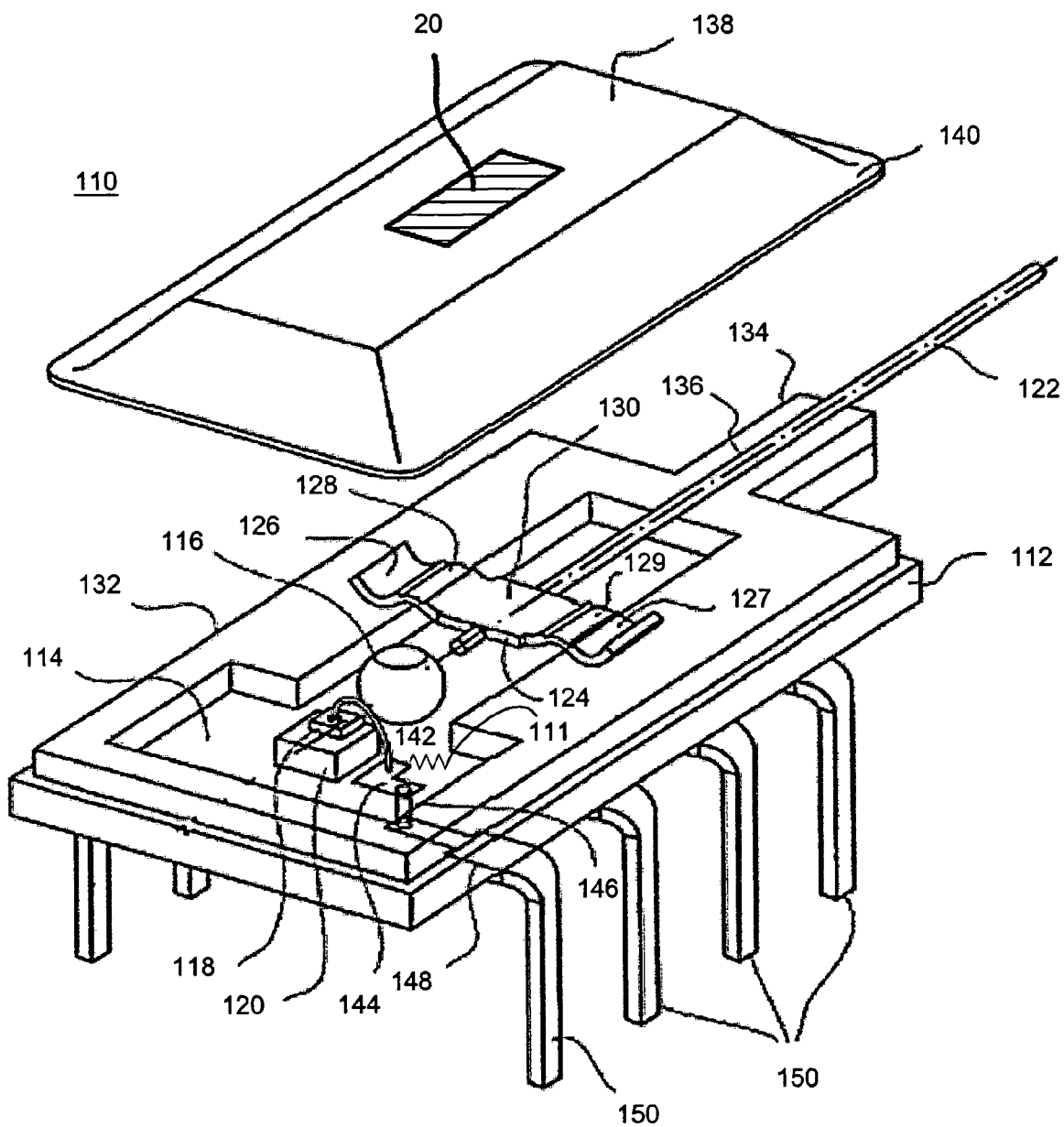
FIG. 2 is an exemplary hermetically sealable opto-electronic package including a resistive thermal device (RTD) sensitive to hydrogen according to embodiments of the invention.

FIG. 2 shows by way of example a hermetic enclosure used for optoelectronic packaging 110 which includes a hydrogen vent 20 according to embodiments of the invention. The optoelectronic package 110 may be form part of a tunable laser communication system. The assembly comprises a substrate 112 with a positioning floor 114. A raised platform 120 may be attached to positioning floor 114. Optical elements, or components, are mounted on positioning floor 114 and platform 120. A lens 116 is mounted on substrate 112, and an edge emitting optoelectronic element 118, such as, for example, a laser diode, is mounted on platform 120. An RTD 111 such as that described above may also be present for temperature control of the laser diode. Other optical components may be used.

An optical fiber 122 may be attached to on a flexure 124, by, for example, soldering, brazing or welding. The flexure 124 comprises two legs 126 and 127, a bridge 130, and two spring regions 128 and 129 at the junction of legs 126 and 127 and bridge 446 130. A flame 132 may be attached to substrate 112. The ends of legs 126 and 127 are attached to frame 132. The frame 132 has a protruding arm 134 having a groove 136. Groove 136 permits the hermetic passage of the fiber 122 to the outside of the package 110.

A cap 138 is attached to frame 132, creating an airtight seal. By enclosing and hermetically sealing positioning floor 114, the optical components within are kept in a controlled gaseous, liquid or vacuum environment that protects them and prevents degradation in their performance and/or lifetime. In one embodiment, cap 138 has a top hat shape and an peripheral lip 140 that can be hermetically sealed to the outside portion of frame 132 and on top of grove 136 and fiber 122. The hermetic seal may be created by a process such as seam welding, soldering or adhesive bonding. The cap may include a vent 20 as previously described. The vent 20 may comprise an opening in the cap 138 covered with a hydrogen selective permeable membrane such as Palladium or a palladium alloy. Once the package is sealed, outgas hydrogen may escape the interior of the package through the vent 20.

Wire bond 142 connects active optical element 118 to electrically conductive pattern 144 which is on the top side of positioning floor 114. Filled conductive via 146 hermetically connects pattern 144 to electrically conductive pattern 148 on the bottom side of positioning floor 114. Pins 150 on the bottom side of positioning floor 114 are also provided for connections to electronic component inside the package through other vias (not shown). The combination of patterns 148 and 144 and filled via 146 provide an efficient and low-parasitic mechanism for hermetically distributing electrical signals from optoelectronic elements inside the hermetic enclosure to pins 150 at the periphery of package 110. Alternatively, signals can be distributed to ball grid array underneath the package for surface mounting.

Embodiments of the invention may benefit hermetically sealed products which are sensitive to hydrogen, such as, for example, High Electron Mobility Transistor (HEMT) devices, Microwave Monolithic Integrated Circuit (MMIC) Amplifiers, and tunable lasers. Reliability and lifetime can be significantly enhanced. Also, by promptly removing hydrogen from the enclosure, water vapor that would have resulted over device lifetime may be reduced. Allowing a vent for hydrogen results in a very low partial pressure of $H_2$ in the package, preserving the absolute wavelength accuracy of the tunable laser.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An apparatus, comprising: a resistive thermal device (RTD) sensitive to hydrogen;
    a material to out gas trapped hydrogen;
    a sealed enclosure housing the RTD and the material, the RTD comprising a platinum layer and one of a chromium and titanium adhesion layer;
    an inert gas atmosphere within the sealed enclosure;
    an opening in the sealed enclosure to form a vent; and
    a hydrogen selective permeable membrane covering the vent to vent out gassed hydrogen from the sealed enclosure.

2. The apparatus as recited in claim 1 wherein the hydrogen permeable membrane comprises palladium (Pd).

3. The apparatus as recited in claim 1 wherein the hydrogen permeable membrane comprises a palladium alloy.

4. The apparatus as recited in claim 2 wherein the enclosure comprises an opto-electronic hermetic package.

5. The apparatus as recited in claim 1 wherein the hydrogen selective permeable membrane caps hydrogen within the enclosure at atmospheric levels.

6. The apparatus as recited in claim 1, wherein the sealed enclosure comprises:
   a substrate;
   a positioning floor on the substrate;
   the RTD arranged in relation to the positioning floor, and a cap sealed over the substrate, wherein the vent is positioned on the cap.

7. A method, comprising:
   sealing a resistive thermal device (RTD) sensitive to hydrogen in an enclosure, the RTD comprising a platinum layer and one of a chromium and titanium adhesion layer;
   sealing a material out gassing trapped hydrogen in the enclosure;
   filling the enclosure with an inert gas atmosphere;
   providing a vent in the enclosure; covering the vent with a hydrogen selective permeable membrane; and
   diffusing out gassed hydrogen through the permeable membrane.

8. The method as recited in claim 7 wherein the hydrogen selective permeable membrane comprises palladium (Pd).

9. The method as recited in claim 7 wherein the enclosure comprises a microelectronic hermetic package.

10. An optical system comprising:
    a hermetic package comprising an interior;
    a temperature tuned laser within the interior;
    a resistive thermal device (RTD) sensitive to hydrogen within the interior to measure temperature, the RTD comprising a platinum layer and one of a titanium and a chromium adhesion layer;
    at least one material to outgas trapped hydrogen within the interior; and
    a vent in the hermetic package comprising a hydrogen selective membrane to diffuse the outgas trapped hydrogen from the interior to an exterior of the hermetic package.

11. The system as recited in claim 10 wherein the hydrogen selective membrane comprises one of palladium and a palladium alloy.

12. The system as recited in claim 11 wherein the hermetic package comprises an optoelectronic package.

13. The system as recited in claim 12 wherein the optoelectronic package forms part of an optical communication system.

14. The system as recited in claim 13 further comprising an optical fiber extending from the hermetic package.

* * * * *